United States Patent [19]

Knoll et al.

[11] Patent Number: 4,788,581
[45] Date of Patent: Nov. 29, 1988

[54] MOS DOSIMETER

[75] Inventors: Meinhard Knoll; Dietrich Bräunig, both of Berlin, Fed. Rep. of Germany

[73] Assignee: Hahn-Meitner-Institut Berlin GmbH, Berlin, Fed. Rep. of Germany

[21] Appl. No.: 717,703

[22] Filed: Mar. 29, 1985

[30] Foreign Application Priority Data

Apr. 10, 1984 [DE] Fed. Rep. of Germany ...... 34138293

[51] Int. Cl.⁴ .................... H01L 27/14; G01T 1/24; G01T 1/22
[52] U.S. Cl. .................... 357/29; 250/370.07; 557/23.1; 557/52; 557/54
[58] Field of Search ............ 357/29, 23.1, 23.6, 357/23.13, 52, 54; 250/370.01, 370.07, 370.14

[56] References Cited

U.S. PATENT DOCUMENTS

| | | | |
|---|---|---|---|
| 3,569,704 | 3/1971 | Mitchell | 357/29 |
| 3,999,209 | 12/1976 | Wrigley et al. | 357/29 |
| 4,200,841 | 4/1980 | Nagata et al. | 357/54 |
| 4,213,045 | 7/1980 | Fraass et al. | 250/370.07 |

OTHER PUBLICATIONS

Ciarla, "MOSFET Detector Evaluation", IEEE Trans. Nuc. Sci., vol. 21, No. 1, Feb. 1974, pp. 390-394.

Primary Examiner—William L. Sikes
Assistant Examiner—Georgia Y. Epps
Attorney, Agent, or Firm—McGlew and Tuttle

[57] ABSTRACT

In known MOS dosimeters for measuring an energy dosage within radiation fields, which comprise a semiconductor substrate with an insulator layer and a metal contact or poly-si-contact, a measurement is taken and irreversible damage is done to the insulator layer. Prior art dosimeters of this kind cannot be electrically reset, nor can such MOS structures be directly integrated with evaluating electronics. The present invention avoids these drawbacks by providing a hard-radiation resistant insulator layer with a floating gate X. Such a resistant insulator layer is produced in a "hardened" process by thermal dry oxidation of silicon at low temperatures of about 850° to 950° C. The inventive dosimeter makes it possible to integrate, on the floating gate, both negative and positive charges. This permits an integration of MOS sensors and signal processing electronic elements on a single chip. By providing a concentrator, the sensitivity of the inventive MOS dosimeter can be augmented by several orders of magnitude, as compared to conventional devices.

18 Claims, 8 Drawing Sheets

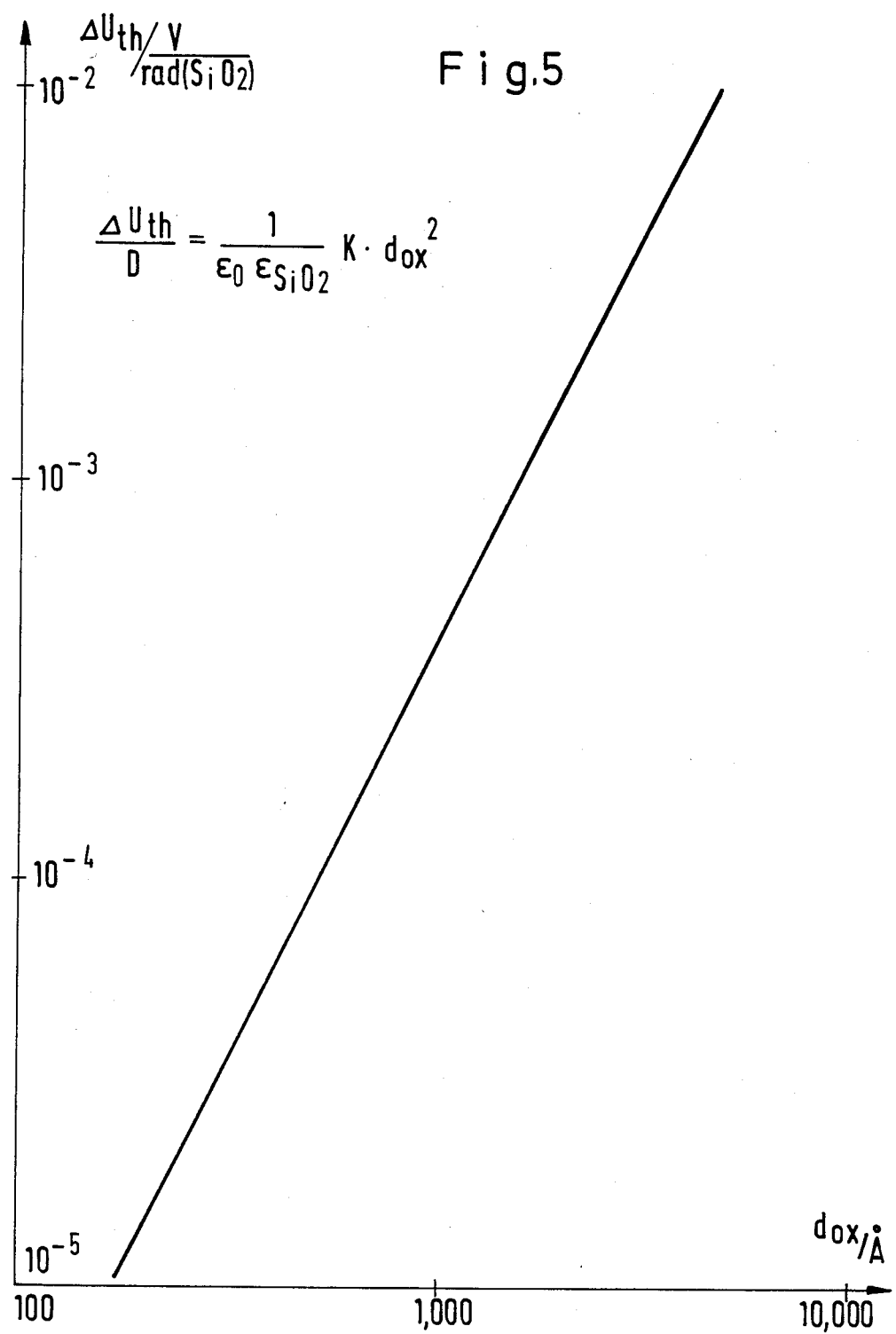

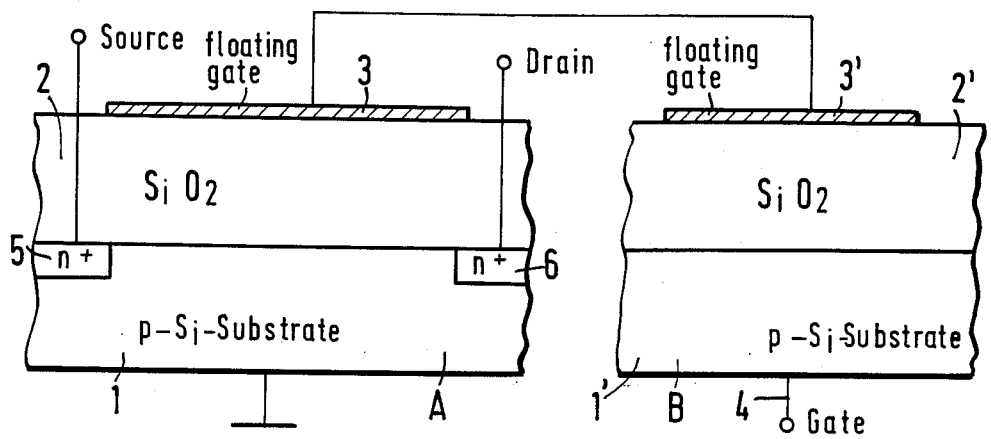
Fig.8
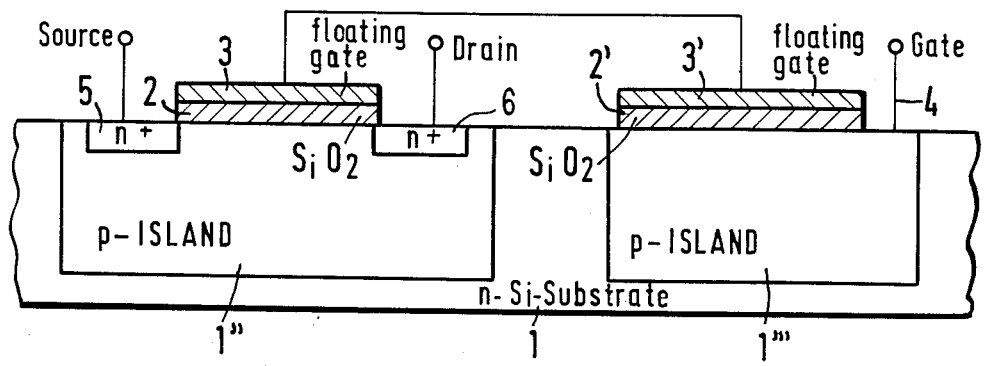
Fig.9
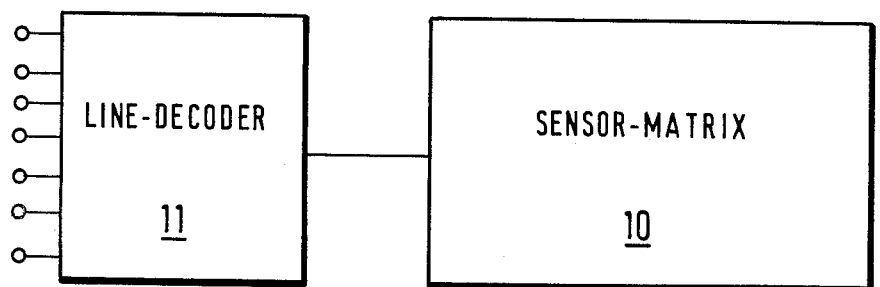
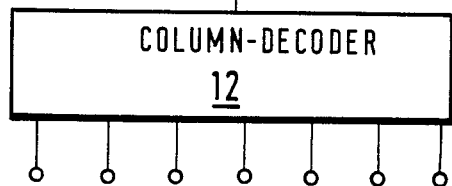
Fig.10

MOS DOSIMETER

FIELD AND BACKGROUND OF THE INVENTION

The present invention relates in general to radiation dosimeters, and in particular to a new and useful MOS dosimeter which can measure a dosage of radiation using non-destructive changes or variations which can be measured and with the dosimeter being resettable for taking a new measurement.

MOS dosimeters of known kind may be used particularly as sensors for monitoring areas exposed to radiation, such as area of nuclear power plants, for personal protection in such environments, or space vehicles, and as a dosimeter for positional resolution by determining the energy dose by location and time.

The principle of an MOS dosimeter is known, for example, from the article "A New Direct Reading Solid-State Dosimeter" by Ian Thomson (*Canadian Astronautics Limited,* 28, Annual Conference of the Health Physics Society, June 1983, Baltimore, Md.). According to this article, electron-hole pairs are generated in the oxide of MOS structures under ionizing irradiation. If a voltage is applied during the irradiation to the gate contact of the MOS structure, a part of the electron-hole pairs in the electric field of the oxide is spatially separated so fast that they escape a recombination. Under a positive gate voltage, the electrons leave the oxide through the gate contact, while the holes migrate to the Si/SiO$_2$ interface. In the zone of this interface, a part of the holes, which are movable at room temperature, may be captured in neutral hole traps, so that a positive oxide charge Q$_{fr}$ is formed. For the threshold voltage variation $\Delta U_{th}$ of an MOS transistor occurring in the lower and medium dose region (D<50 Krad(-SiO$_2$)), the following equation applies while neglecting the effect of interface states:

$$\Delta U_{th} = -\frac{\bar{x}}{\epsilon_0 \epsilon_{SiO2}} A K f_H d_{ox} D \quad (1)$$

Wherein $\epsilon_o$ is the dielectric constant of a vacuum, $\epsilon_{SiO2}$ is the dielectric constant of the oxide, and $\bar{x}$ is the location of the charge centroid $\underline{K}$ is the ionization coefficient indicating the generated hole charge per unit volume and per rad (SiO$_2$). The charge yield factor $f_H$ indicates the proportion of electron-hole pairs which do not recombine after their generation. It holds that:

$$0 \leq f_H \leq 1 \quad (1a)$$

D stands for the absorbed dose, and $d_{ox}$ for the thickness of the oxide layer. A indicates the proportion of holes which get captured in the neutral traps wherein $0 \leq A \leq 1$.

It follows from equation (1) that:

$$\Delta U_{th} \sim D \quad (2)$$

This proportionality between the absorbed dose D and the threshold voltage shift $\Delta U_{th}$ is varied as long as the number of holes captured in neutral traps is small relative to the number of hole traps capable of trapping. The relation (2) makes it possible to use MOS varactors or MOS transistors as dosimeters. Such MOS dosimeters may be considered prior art.

The use of such a simple MOS dosimeter has the following disadvantages: The measuring process involves damaging of the MOS structure. This damage is caused by capturing holes in traps in the Si/SiO$_2$ interface zone, and although it changes the threshold voltage $\Delta U_{th}$ as desired, other electrical properties of the MOS structure are thereby impaired. For example, fast and slow interface states are produced. The fast interface states reduce the slope of the MOS transistor and unfavorably affect the dynamic properties. The slow interface states make the C(U)-curve hysteretic, with the result of instability in the transistor characteristic. The sensitivity ($\Delta U_{th}$/D) of the dosimeter is governed and determined by the hole trapping factor A and depends on numerous imponderable factors in the MOS fabrication process. A sensitive MOS dosimeter must be capable of capturing as many holes as possible. This means that an oxide which is sensitive to radiation must be employed as the insulator layer, collecting a high positive charge already under a small dose of irradiation. Such a sensitive oxide, however, is irreversibly damaged by the radiation, so that the characteristics become unstable (slow interface states). The prior art MOS dosimeter cannot be electrically reset in a simple way. Resetting is possible only through high temperature treatment, for example, which is not desirable however.

The mentioned drawbacks of prior art MOS dosimeters are also the reason why it is not possible to integrate on a chip MOS dosimeter transistors with signal processing electronic elements, without risking damage to these electronic elements. In addition, only negative displacements of the C(U) characteristic can be evaluated, since only positive oxide charges can be collected.

SUMMARY OF THE INVENTION

The present invention is directed to an MOS dosimeter of the above mentioned kind, whose operation does not involve damage to the material, which is electrically resettable, and can be integrated on a chip with signal processing electronic elements without having to expect damage to these elements.

Accordingly, an object of the present invention is to provide a MOS dosimeter for measuring doses within a radiation field which comprises a semiconductor substrate, an insulator layer on the semiconductor substrate which is resistant to radiation and which is provided with a floating gate, and a metal contact connected to the semiconductor substrate, the floating gate being utilized to accumulate a charge which accumulation corresponds to the dosage of radiation and which accumulation can be reset for reusing the dosimeter.

The disadvantages of prior art MOS dosimeters are thereby eliminated. The charge generated in the insulator layer is collected on the floating gate. The hole capturing in the traps of the insulator layer is avoided to a large extent by the fact that even though electron-hole pairs are generated also in the radiation hardened insulator layer, holes are rarely captured in traps. The floating gate is utilized as the new positive charge accumulator collecting both positive and negative charges. To produce the insulator layer which is resistant to radiation, a hardening process is provided, so that an impairment of the electrical properties of the MOS transistors is strongly reduced. The "hardening process" means, for example, a thermal, dry oxidation, particularly of silicon, at low temperatures of about 850° to 950° C. The sensitivity of the dosimeter is mainly determined by the geometry thereof, which makes the dosimeter, to a large extent, independent of the imponderable factors of MOS fabrication. After the ionizing irradiation, the inventive MOS dosimeter can be reset to its initial value, so that the sensor may be calibrated. Since a "hardening process" is used for producing the insulating layer resistant to radiation, the sensors can be integrated on a chip with signal processing electronic elements. This makes it possible, for example, to fabricate also position resolving sensors. The inventive MOS dosimeter permits an integration on the floating gate of both positive and negative charges. This results in positive and negative displacements of the transistor characteristic, permitting a free selection of a transistor type (n- or p-channel).

It must particularly be pointed out that the semiconductor substrate of the industrially important embodiment of the inventive MOS dosimeter is silicon, so that the insulator layer resistant to radiation is a silicon dioxide layer.

It is true that floating gate transistors are known per se, and also in use as memory cells. However, they are not used in MOS dosimeters for the purpose provided by the invention, so that the invention relates to the use of a floating gate, for other purposes, and in connection with an insulator layer, which is resistant to radiation.

A further object of the invention is to provide a method of fabricating an MOS dosimeter for measuring energy doses within a radiation field which comprises forming a silicon oxide layer on a semiconductor substrate by a thermal, dry hardened process at low temperatures of 850° C. to 950° C., the silicon oxide layer forming a radiation hardened insulator layer and providing a metal contact on the semiconductor.

Another object of the invention is to provide an MOS dosimeter which is simple in design, rugged in construction and economical to manufacture.

A further object of the invention is to provide such a dosimeter which non-destructively measures a radiation dosage and which can be reset for taking a new measurement.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following, some embodiments of the invention are explained in more detail, with reference to the drawings in which:

FIG. 5 is a graph showing the maximum sensitivity $\Delta U_{th}/D$ for $d_2 \rightarrow d_{ox}$ as a function of the oxide thickness $d_{ox}$;

FIG. 8 is similar to FIG. 6 and shows a third embodiment;

FIG. 9 is similar to FIG. 6 and shows a fourth embodiment;

FIG. 10 is a block diagram of an area resolving dosimeter composed of a plurality of sensor elements;

FIG. 11b is a sectional view taken along the line b—b of FIG. 11a;

FIG. 11c is a graph showing the potential gradient obtained with an MOS dosimeter according to FIG. 11a;

DESCRIPTION OF THE PREFERRED EMBODIMENTS

Figure 1:
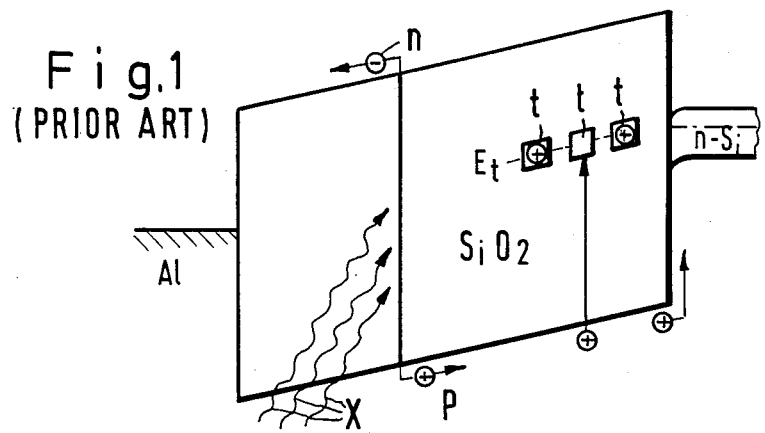
FIGS. 1 and 2a illustrate the principle of a prior art MOS dosimeter.
Figure 2A:
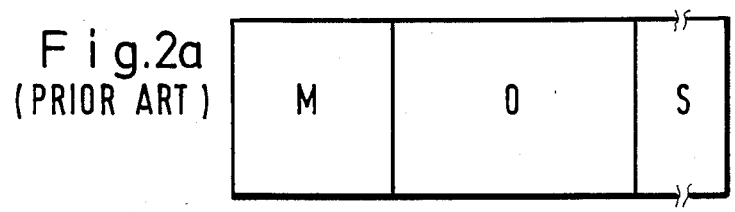

FIGS. 1 and 2a illustrate the design of a prior art MOS dosimeter built up of a silicon substrate S, a layer of silicon dioxide O, and metal electrode M, and indicate an exposure to an ionizing radiation X. Under the ionizing radiation X, electron-hole pairs p and n are generated in the oxide O. If during the irradiation a voltage is applied to the gate contact M, a part of the electron-hole pairs n,p in the electron field of oxide O become spatially separated so fast that they fail to recombine. Under a positive gate voltage, the electron leave oxide O through the gate contact M, while the holes migrate to the Si—SiO$_2$ interface. In the zone of this interface, a portion of the holes may be captured in neutral traps t, so that a positive oxide charge $O_{fr}$ is generated. This causes the drawbacks discussed above.

Figure 3A:
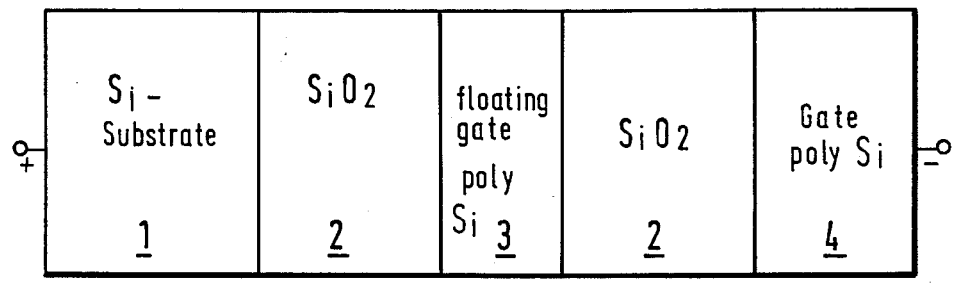
FIGS. 3a and 3b illustrate the principle of an inventive MOS dosimeter.
Figure 3B:
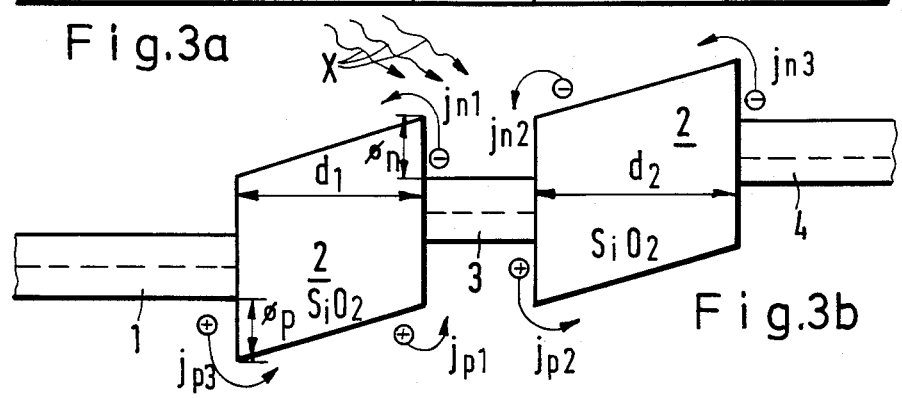

The inventive MOS dosimeter is for comparison illustrated in FIGS. 3a and 3b. It is built up of a silicon substrate 1, a silicon dioxide layer 2 resistant to radiation, a floating gate 3 imbedded in layer 2 and consisting of polysilicon or a metal, an electrode (gate) 4, also of polysilicon or metal. According to FIG. 3b, a negative voltage is applied to gate 4. If a positive voltage is applied, the same occurs as explained in the following, only the signs change analogously. The silicon dioxide layer 2 resistant to radiation has been produced, for example, in a hardened process by thermal dry oxidation of silicon at low temperatures of about 850° to 950° C. Under the ionizing radiation X, electron-hole pairs are generated in the oxide layer, whereby streams by electrons $j_n$ and holes $j_p$ are produced as indicated in FIG. 3b. In addition, electrons and holes flow as photocurrents through the various interfaces of the silicon dioxide layer 2. Hole currents develop as follows:

$j_{p1}$ from oxide layer 2 to floating gate 3 where the current is collected;

$j_{p2}$ from floating gate 3 as a photocurrent to oxide layer 2, wherefrom this hole current flows off; and $j_{p3}$ from silicon substrate 1 through oxide layer 2 to floating gate 3, where this hole current is collected.

Further, the following electron currents develop:

$j_{n1}$ as a photocurrent from floating gate 3 to oxide layer 2, wherefrom this current flows off;

$j_{n2}$ from oxide layer 2 to floating gate 3, where this current is collected; and $j_{n3}$ as a photocurrent from gate contact 4 through oxide layer 2 to floating gate 3 where this current is collected.

Since in an oxide layer 2 resistant to radiation the charge trapping can, to a large extent, be eliminated in the lower and medium dose region, the charges are collected only on floating gate 3. This results in the following current balance for floating gate 3:

The charge variation on floating gate 3 is determined by the divergence of the current density.

$$\frac{\delta Q_{fg}}{\delta t} = \text{div} j \qquad (3)$$

For dosimeter applications, it must be true that:

$$\frac{\delta Q_{fg}}{\delta t} \neq 0 \rightarrow \text{div} j \neq 0 \qquad (4)$$

The charge balance on floating gate 3 is:

$$Q_{fg}(t) = \int_0^t (j_{p1} + j_{p3} - j_{p2} + j_{n1} - j_{n2} - j_{n3}) dt \qquad (5)$$

With equal barrier heights $\phi_p$ and $\phi_n$ at the interfaces, it is true that:

$$(j_{n1} = j_{n3})(j_{p3} = j_{p2}) \qquad (6)$$

Equation (5) thus is reduced to:

$$Q_{fg}(t) = \int_0^t (j_{p1} - j_{n2}) dt \qquad (7)$$

Depending on the amounts of $j_{p1}$ and $j_{n2}$, positive or negative charges can be present on floating gate 3. The amounts of $j_{p1}$ and $j_{n2}$ depend on the respective generation volume wherefrom they originate, so that it holds that:

$$(j_{p1} \sim d_1) \text{ and } (j_{n2} \sim d_2) \qquad (7a)$$

and, for the charge $Q_{fg}$ collected on floating gate 3, that:

$$Q_{fg} = K f_h (d_{ox} - 2d_2) D \qquad (8)$$

Figure 4A:
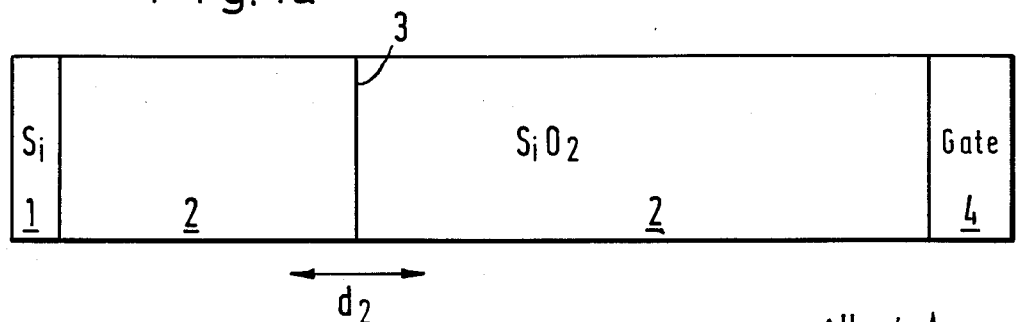
FIGS. 4a and 4b show the threshold voltage shift $\Delta U_{th}$ as a function of the distance $d_2$, for various oxide thicknesses $d_{ox}$.

FIG. 4a shows the MOS dosimeter in a simplified manner. Charge $Q_{fg}$ is shown as a thin charge sheet at a distance $d_2$ from gate contact 4. The following equation is valid for the threshold voltage shift $\Delta U_{th}$ of such an MOS transistor:

$$\Delta U_{th} = -\frac{d_2}{\epsilon_o \epsilon_{siO2}} Q_{fg} \qquad (9)$$

From equations (8) and (9) it follows that:

$$\Delta U_{th} = -\frac{d_2}{\epsilon_o \epsilon_{siO2}} K f_h (d_{ox} - 2d_2) D \qquad (9a)$$

Figure 4B:
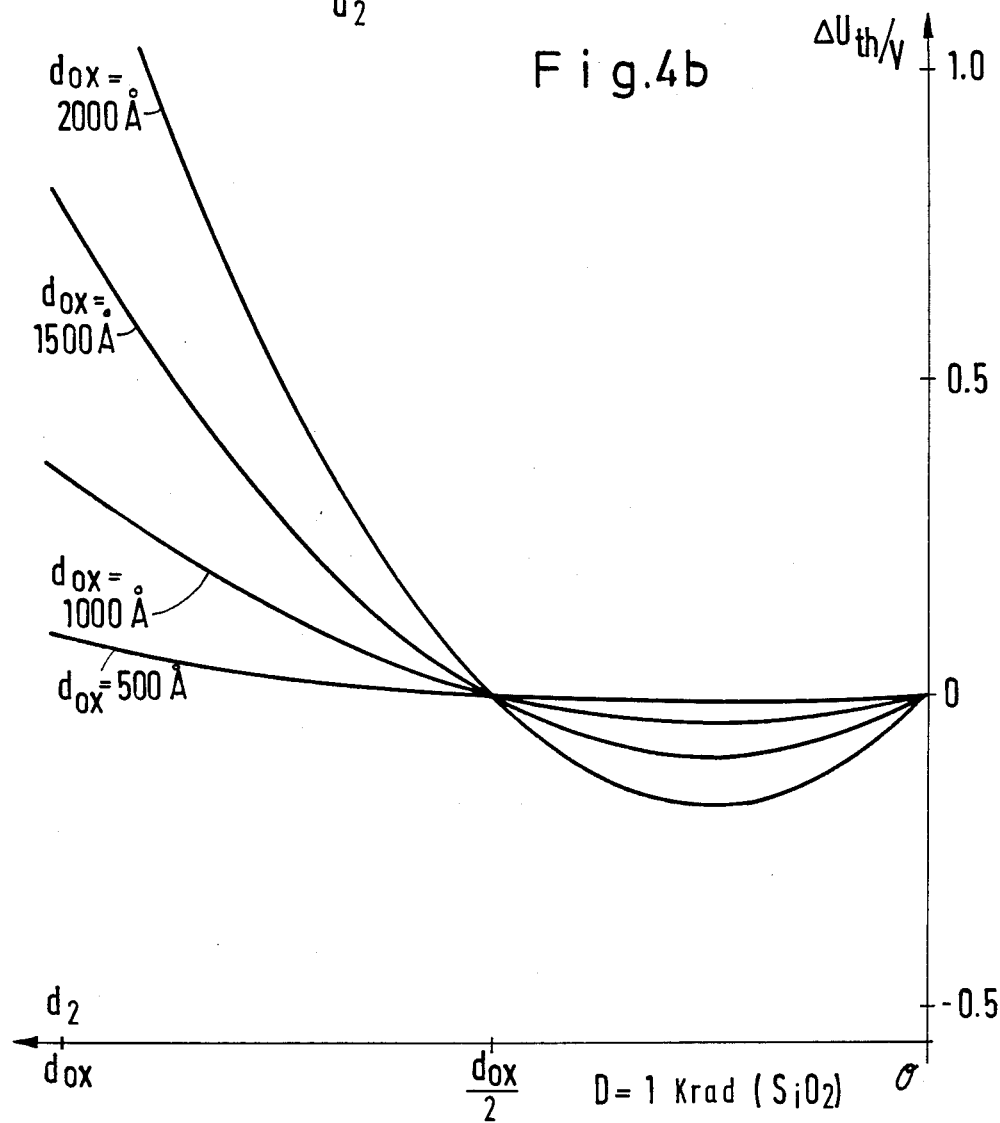

FIG. 4b shows the threshold voltage shift $\Delta U_{th}$ as a function of the distance $d_2$ for various thicknesses $d_{ox}$ of oxide layer 2. Apparently, the sensitivity of the MOS dosimeter is a function of distance $d_2$ and thickness $d_{ox}$ of the oxide layer, with the effect of the field-dependent charge yield $f_H$ being negligible for electric fields $F > 1$ MV/cm($f_H = 1$).

FIG. 4b has been obtained by computation, by displacing floating gate 3 between silicon substrate 1 and gate contact 4 from the left to the right. With the thicknesses of oxide layers equal to each other, the nodal point is reached, which cannot be evaluated in measuring terms. A particularly high sensitivity is obtained, according to FIG. 4b, if floating gate 3 is provided close to silicon substrate 1.

Figure 2B:
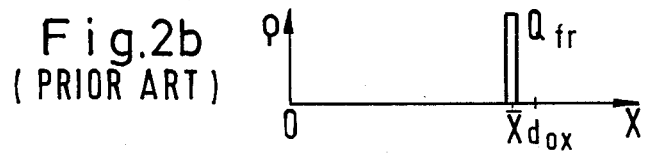
FIG. 2b is a graph showing the principle of a prior art dosimeter.

FIG. 5 shows the maximum sensitivity ($\Delta U_{th}/D$) for $d_2 \rightarrow d_{ox}$ as a function of the thickness $d_{ox}$ of oxide layer 2. The maximum theoretical sensitivity of a simple MOS dosimeter according to FIG. 2 corresponds to this maximum sensitivity.

After an irradiation of the MOS dosimeter by an ionizing radiation X, the built-up oxide charge $Q_{fg}$ may be removed from floating gate 3. Two methods are possible:

1. The MOS dosimeter is irradiated, with an opposite voltage applied to the gate. This brings charges of the opposite sign to floating gate 3.

2. The oxide charge is removed by an avalanche injection, so that electrons pass from the silicon substrate 1 to floating gate 3 where they can compensate for a positive charge.

For particular designs of MOS dosimeters, it should be noted that the amount of charge generated on floating gate 3 by ionizing irradiation is given by the differential current density ($j_{p1} - j_{n2}$), according to equation (7). These current densities are proportional to the generation volumina from which they originate. The charge $Q_{fg}$ resulting from the difference ($j_{p1} - j_{n2}$) thus can be varied not only by varying the distance $d_2$. The two generation volumina may also be varied by varying the area. Only, the difference in field strength in the two volumina, caused by the voltage divider, must be taken into account. Unequal generation rates in the two generation volumina may also be caused by unequal materials, having $K_1 \neq K_2$.

In the following, some embodiments of the inventive MOS dosimeter are explained in more detail. They are all based on silicon technology. Other materials may also be employed, however.

Figure 6:
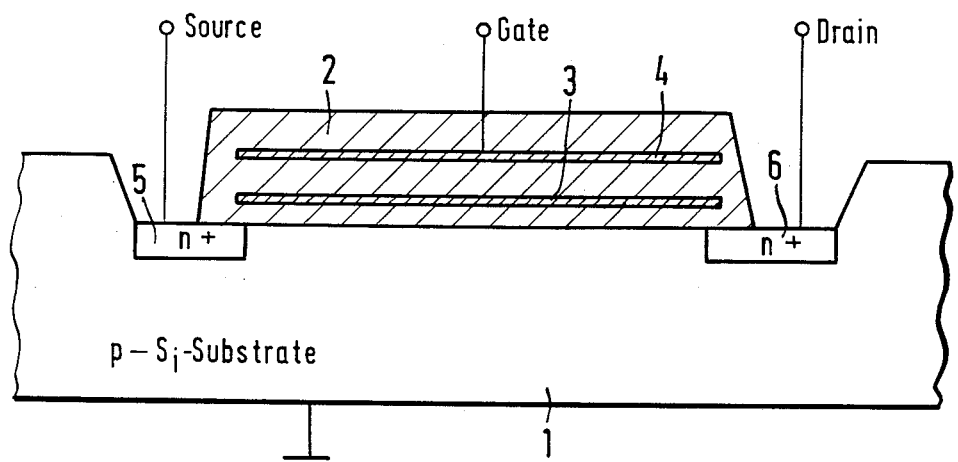
FIG. 6 shows a first embodiment of an MOS dosimeter in side sectional view.

FIG. 6 shows the first embodiment. A second substrate 1 is provided and a silicon dioxide layer 2 is formed thereon, in a "hardened process", in which a floating gate 3 and a gate, namely electrode 4, are imbedded, one above the other. The silicon substrate 1 is of the p-type. Connections 5 and 6 serving as the source and drain electrodes are of the n-type. This structure corresponds substantially to that of FAMOS transistors. The silicon dioxide layer 2 has been formed by a "hardened process", namely a thermal dry oxidation of silicon at low temperatures of about 850° to 950° C.

Figure 7:
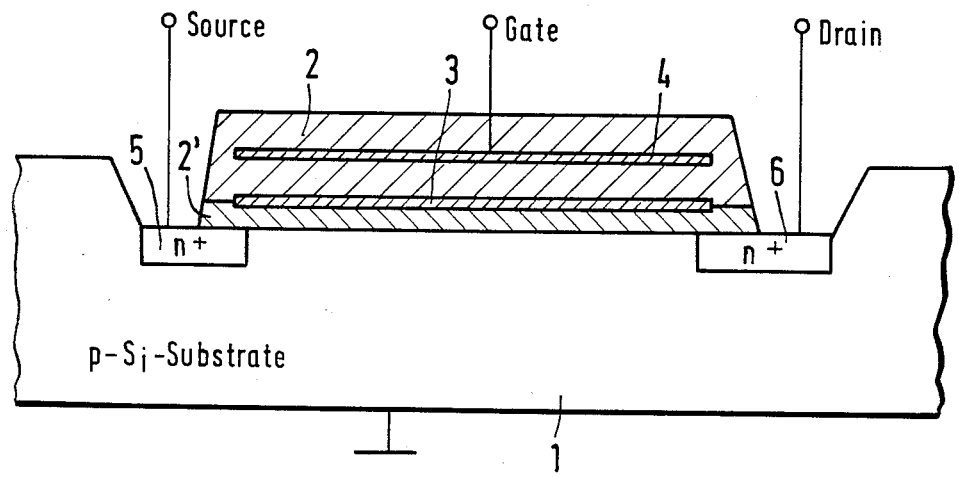
FIG. 7 is similar to FIG. 6 and shows a second embodiment.

FIG. 7 shows an embodiment with different insulating materials 2. and 2' between which the floating gate 3 is imbedded. The metallic gate electrode 4 is imbedded in the second insulator layer 2. Source and drain electrodes 5,6 are provided in the same manner as in the embodiment according to FIG. 6. In both a polysilicon floating gate 3 and a polysilicon gate 4 are used. In the embodiment of FIG. 7, the ionization coefficient K of the two insulating materials 2,2' are different.

The vertical structures of the first and second embodiments, i.e. of FIGS. 6 and 7, may also be broken up, as shown in the further embodiments of FIGS. 8 and 9. FIG. 8 shows an MOS dosimeter structure using two chips A,B. Chip A comprises a p-type silicon substrate 1 with an applied silicon dioxide layer 2 and a floating gate 3, and source and drain electrodes 5,6. Chip B similarly comprises a p-type silicon substrate 1' with a silicon dioxide layer 2' and a floating gate 3'. Floating gate 3,3' are electrically conductively connected to each other. The p-type silicon substrate 1' of chip B is employed as the gate contact 4. The two floating gates 3,3', might also have different dimensions, to obtain the desired sensitivity of the MOS dosimeter. These embodiments are provided with a coating of a layer resistant to radiation, or accommodated in evacuated housing.

In the fourth embodiment, shown in FIG. 9, the embodiment of FIG. 8 is integrated in a single chip of an n-type silicon substrate 1. Imbedded in this substrate are two p-type islands 1" and 1''', each provided with a silicon dioxide layer 2,2' and a floating gate 3,3', which latter are electrically conductively connected to each other. The source and drain electrodes 5,6 are provided in p-type island 1" while the gate contact 4 is provided at the other p-type island 1'''.

In the fifth embodiment of FIG. 10, a plurality of sensor elements is united into a sensor matrix 10 and integrated on a chip. Sensor matrix 10 is connected to a line decoder 11 and a column decoder 12. Area resolving MOS dosimeters may thus be built.

With the embodiments described in the following, an increased sensitivity can be obtained through the floating gates 3. The maximum sensitivity of an MOS dosimeter is $\Delta U_{th}/D \approx 1$ mV/Rad (SiO$_2$) for $d_{ox} = 1000$ Å. As shown in FIG. 5, this sensitivity may be augmented by increasing the thickness $d_{ox}$ of the oxide 2, i.e. the generation volume. However, technological limits are set to such an increase in thickness of the oxide. The generation volume may also be increased by increasing the area of the sensor. Only, this does not lead to an augmented sensitivity, since the threshold voltage shift $\Delta U_{th}$ is a function of the surface charge density collected on floating gate 3 and resulting from equation (9).

In accordance with the invention, the sensitivity of the dosimeter can be augmented by concentrating the generated charge. The charge generated within an area $F_2$ is concentrated within an area $F_1$ which is smaller than $F_2$. This increases the surface charge density beneath area $F_1$. In practice, this concentration is obtained by producing a potential gradient on floating gate 3.

Figure 11A:
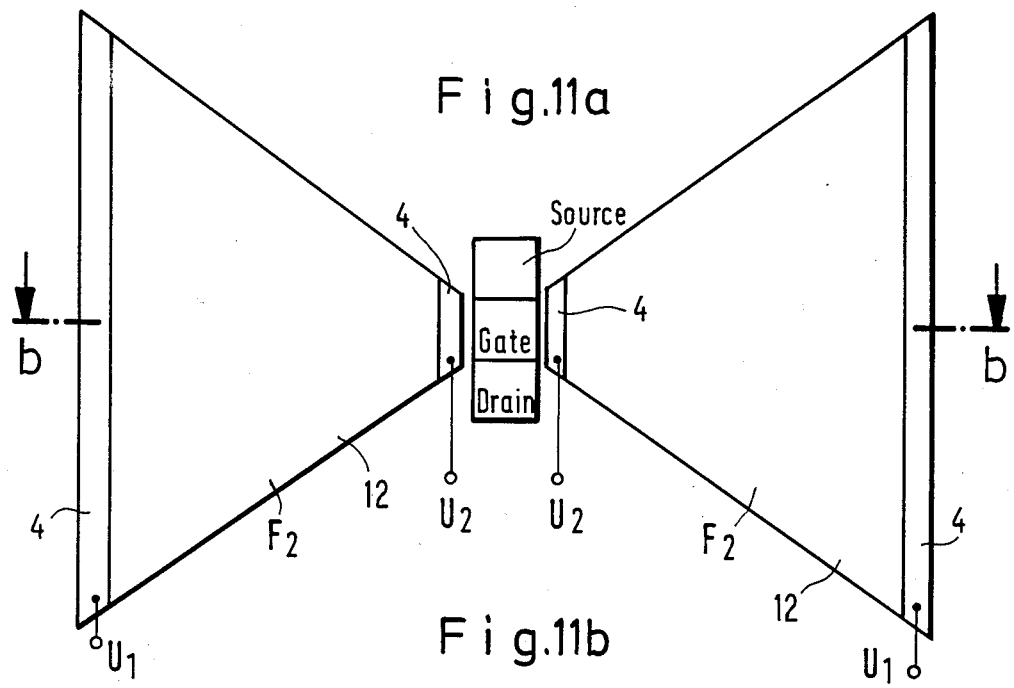
FIG. 11a is a top plan view of a fifth embodiment of an MOS dosimeter of particularly high sensitivity.
Figure 11B:
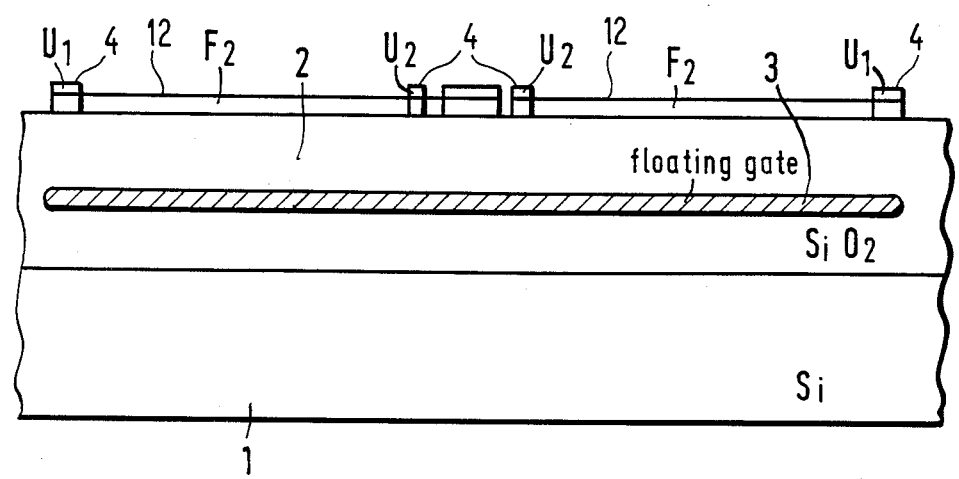
Figure 11C:
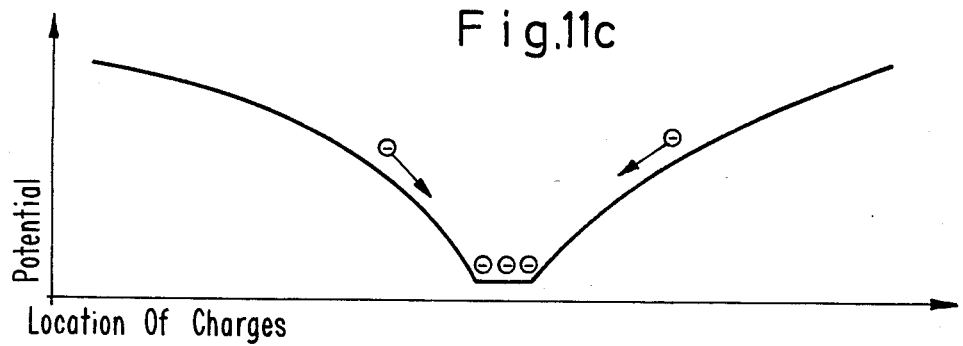
Figure 12A:
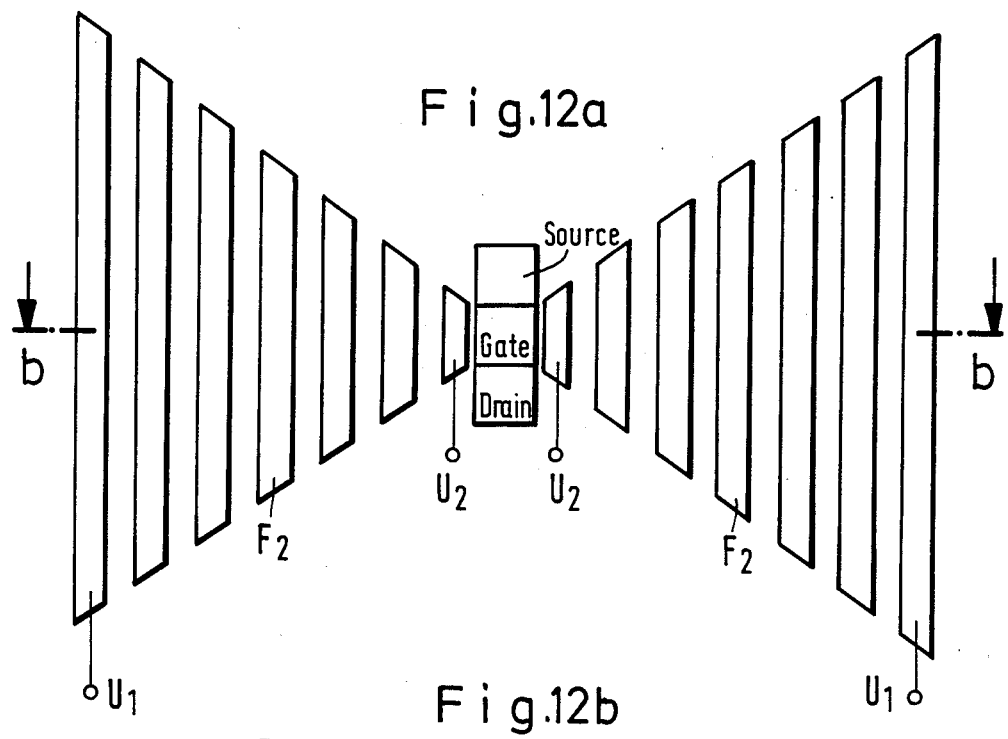
FIGS. 12a, 12b and 12c correspond respectively to FIGS. 11a, 11b and 11c and show a sixth embodiment of the inventive highly sensitive MOS dosimeter.
Figure 12B:
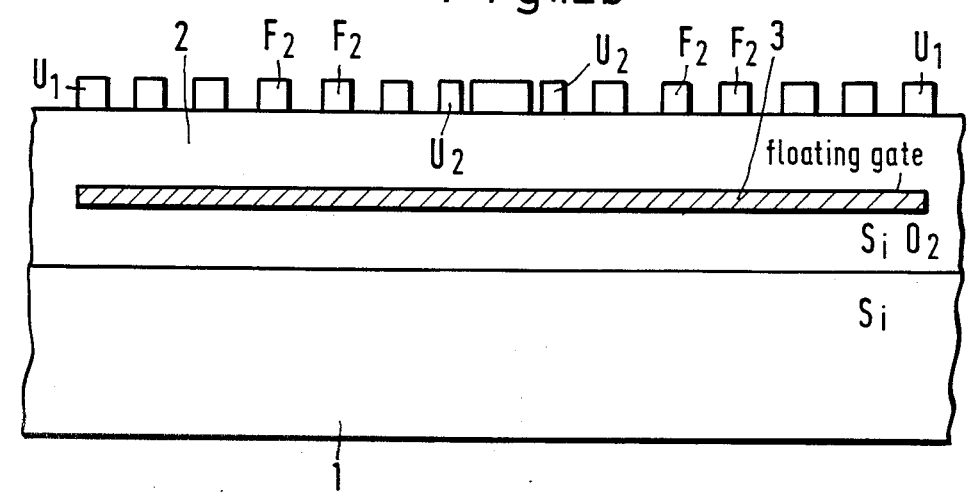
Figure 12C:
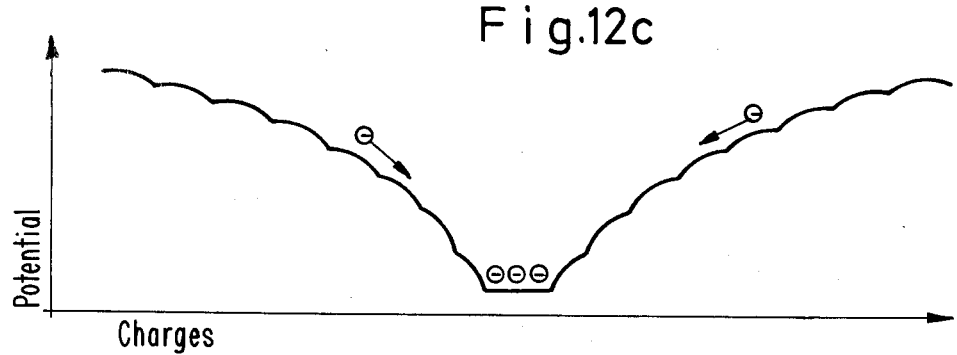

FIGS. 11a to 12c show two embodiments in which such a potential gradient is obtained by producing a voltage drop in a highly resistive gate material (FIG. 11), or by a capacitive voltage division in an interrupted gate structure (FIG. 12). Due to capacitive coupling, the potential gradient reflects on the floating gate. The charges collected on floating gates 3, such as electrons, flow into the potential trough (FIGS. 11c and 12c) where they concentrate. The charge transfer process may be expressed by the following continuity equation:

$$\frac{\delta n}{\delta t} = \frac{\delta}{\delta x}\left( \mu_n n\, E(x,t) + D_n \frac{\delta n}{\delta x} \right) \quad (11)$$

Two driving mechanisms are at work:
(a) the electric field E(x,t), comprising the produced potential gradient and the field induced by the charge inself; and
(b) the concentration gradient of the charge on floating gates 3.

The charge increase bears on the silicon surface potential and the potential trough is flattened. Therefore, with an increasing charge, the concentrator effect decreases. Since concentrators make sense only within the region of small doses, i.e. small charge accumulations, the problem becomes unimportant. Dealing with charge transfers and the charge handling capability in exact mathematical terms is known from the technique of charge coupled devices (CCD). This involves a simultaneous numerical solution of the continuity equation and Poisson's equation.

Figure 13:
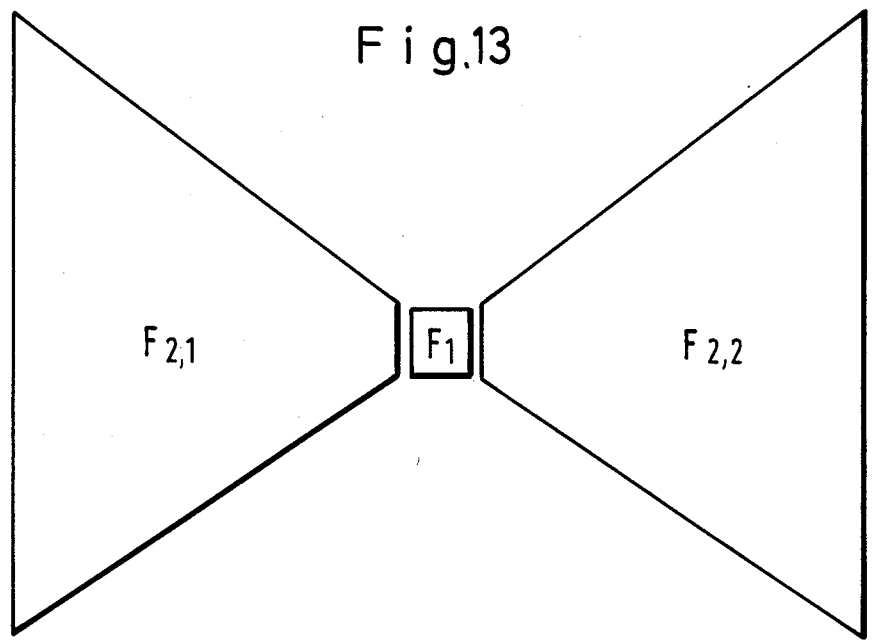
FIG. 13 illustrates the proportion between the active sensor area $F_2$ and the transistor gate area $F_1$ in the embodiment of FIGS. 11a, 11b, 11c and 12a, 12b, 12c.

The augmentation of the sensitivity of the dosimeter by charge concentration is expressed by:

$$\frac{\Delta U_{th}^*}{D} = M \cdot \frac{\Delta U_{th}}{D} \quad (12)$$

wherein $\Delta U_{th}^*$ is the sensitivity with, and $\Delta U_{th}$ the sensitivity without a concentrator. The concentrator parameter M is given by the ratio of the active sensor $F_2$ to the transistor area $F_1$ which areas are shown in FIG. 13. With a sensor area $F_2 = 1$ cm$^2$ and a transistor gate area $F_1 = 10^{-6}$ cm$^2$, a concentrator parameter $M = 10^6$ is obtained. This results in a dosimeter sensitivity of about 1 V/$10^{-3}$ rad (SiO$_2$).

According to FIGS. 11a and 11b highly resistive trapazoidal resistance layers 12 are applied onto layer 2 in symmetrical arrangement, with marginal low-resistance connecting strips 4 for applying voltage U$_1$, U$_2$. A drop of potential between the values U$_1$ and U$_2$ results therefrom on the highly resistive layer F$_2$. By capacitive coupling, the potential gradient reflects also on the floating gate. Charges (for example electrons) which have accumulated on the floating gate flow into the formed potential trough. This increases the surface charge density in the transistor gate area and thus the effect produced on the transistor characteristic. This concentration effect is produced by a drop of potential on at least one resistance layer F$_2$ of no preferential configuration. In the example of FIGS. 11a and 11b a trapezoidal configuration is selected.

In the example of FIGS. 12a and 12b, instead of large area resistance layer F$_2$, strips of metal of polysilicon are provided, i.e. a conducting structure with individual areas F$_2$. The desired voltage drop builds up due to capacitive voltage division across the strip structure and floating gate 3, effecting the concentration indicated in FIG. 12c of the accumulated charges in the potential trough.

Figure 14:
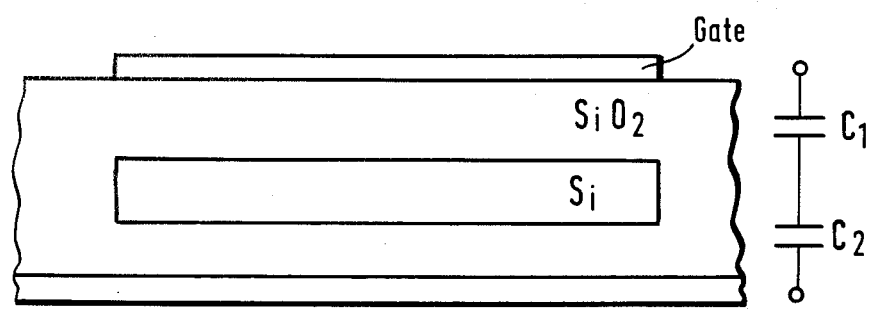
FIG. 14 shows a special embodiment of a floating substrate dosimeter with a corresponding equivalent circuit diagram.

FIG. 14 shows a special embodiment of the MOS dosimeter. By emaciating the floating gate dosimeter, a floating substrate dosimeter is obtained having the equivalent circuit diagram also shown in FIG. 14. By charge accumulation on the substrate, backside capacitance C$_2$ is changed, whereby threshold voltage $\Delta U_{th}$ is displaced. The same conditions apply to a floating substrate, as to a floating gate.

The floating gate configurations provided in the embodiments according to FIGS. 8, 9 and 14 may be produced in a conventional MOS fabrication process by applying a metal layer (such as Al, Au etc.) by vapor deposition or precipitating (CVD) a polycrystalline silicon layer. This is entirely compatible with the process of applying a layer which is resistant to radiation.

The imbedding of a floating gate according to FIG. 6 may be effected as follows:

As explained above, the material of a floating gate is applied onto a thermally oxidated SiO$_2$ layer. This structure is then coated with an SiO$_2$ layer produced by CVD.

The invention thus is an MOS dosimeter for non-destructively measuring energy doses within radiation fields, comprising a semiconductor substrate, an insulator layer on said substrate and a metal contact connected to said insulator layer, said insulator layer being resistant to radiation and having a floating gate connected thereto.

The invention is also a method of fabricating such an MOS dosimeter for measuring energy doses within radiation fields, wherein the insulator layer is made of silicon oxide and is resistant to radiation by producing it in a thermal, dry hardening process at low temperatures of 850° to 950° C.

While specific embodiments of the invention have been shown and described in detail to illustrate the application of the principles of the invention, it will be understood that the invention may be embodied otherwise without departing from such principles.

What is claimed is:

1. An electrically resettable MOS dosimeter for non-destructively measuring energy doses of a radiation field in dependance upon corresponding measurable changes in electric charges relative to an initial value and which dosimeter is electrically resettable to such initial value for taking a new such measurement, which comprises a semiconductor substrate having source and drain electrodes, an insulator layer applied to said semiconductor substrate with said source and drain electrodes adjacent thereto, said insulator layer being composed of radiation resistant material which is capable of capturing radiation and which has been radiation hardened sufficiently to render said insulator layer hardened to radiation and resistant to damage by such radiation yet which is capable of capturing such radiation, an electrode gate contact connected to said insulator layer, a floating gate embedded in said insulator layer, and means for applying a voltage to said electrode gate contact such that when said insulator layer is exposed to a radiation field, and a voltage is applied to said electrode gate contact, charges are generated by said insulator layer and are collected by said floating gate in dependence upon the radiation dosage, which charges are electrically resettable to such initial value for taking a new such measurement.

2. Dosimeter of claim 1 wherein said substrate is silicon and said insulation layer is a silicon dioxide film.

3. Dosimeter of claim 1 wherein said insulator layer is a silicon dioxide layer which is produced by oxidizing silicon in a thermal, dry hardening process at low temperatures of 850° to 950° C.

4. Dosimeter of claim 1 wherein said floating gate is embedded as an interfacial layer between two different insulating materials forming said insulator layer, said two different insulating materials having different ionizing coefficients.

5. Dosimeter of claim 1 including a first chip and a second chip, said first chip being formed of a first said semiconductor substrate having said source and drain electrodes, a first said insulator layer applied to said first semiconductor substrate with said source and drain electrodes adjacent thereto and a first said floating gate, and said second said chip being formed of a second semiconductor substrate, a second said insulator layer and a second said floating gate, said second semiconductor substrate forming said electrode gate contact, and means for conductively connecting said floating gates of said chips to each other.

6. Dosimeter of claim 5 including a base semiconductor substrate, said first and second semiconductor substrates being formed as substrate material islands in said base substrate, said first and second layers being applied respectively to said islands and said conductively connected floating gates being applied respectively to said layers, with one of said islands forming said electrode gate contact, said layers being made of different insulating materials having different ionizing coefficients.

7. Dosimeter of claim 1 including at least one resistance layer formed on said insulator layer and shaped with a larger area than said insulator layer to produce a potential drop on said floating gate.

8. MOS dosimeter for non-destructively measuring energy doses of a radiation field, comprising a semiconductor substrate having source and drain electrodes, an insulator layer applied to said semiconductor substrate with said source and drain electrodes adjacent thereto, said insulator layer being composed of radiation resistant silicon dioxide, said insulator layer constituting a radiation hardened layer which has been produced by oxidizing silicon in a thermal, dry hardening process at low temperatures of 850° to 950° C. sufficiently to render said insulator layer hardened to radiation and resistant to damage by such radiation, a metal contact connected to said insulator layer, a floating gate embedded in said insulator layer, and means for applying a voltage to said metal contact such that when said insulator layer is exposed to a radiation field and a voltage is applied to said metal contact, charges are generated by said insulator layer and are collected by said floating gate.

9. Dosimeter of claim 8 wherein said floating gate is embedded as an interfacial layer between two different insulating materials forming said insulator layer.

10. Dosimeter of claim 8 including a first chip and a second chip, said first chip being formed of a first said semiconductor substrate having source and drain electrodes, a first said insulator layer applied to said first said semiconductor substrate with said source and drain electrodes adjacent thereto and a first said floating gate, and said second chip being formed of a second semiconductor substrate, a second said insulator layer and a second said floating gate, said second semiconductor substrate forming said electrode gate contact, and means for conductively connecting said floating gates of said chips to each other.

11. Dosimeter of claim 10 including a base semiconductor substrate, said first and second substrates being formed a substrate material islands in said base substrate, said first and second insulator layers being applied respectively to said islands and said conductively connected floating gates being applied respectively to said insulator layers, with one of said islands forming said contact, said insulator layers being made of different insulating materials.

12. Dosimeter of claim 8 including at least one resistance layer formed on said insulator layer and shaped with a larger area than said insulator layer to produce a potential drop on said floating gate.

13. Dosimeter of claim 12 wherein said resistance layer has a trapezoidal configuration, the short side of said trapezoidal configuration facing the region of said floating gate.

14. Dosimeter of claim 13 wherein said resistance layer has a strip array configuration.

15. Dosimeter of claim 12 includes a second resistance layer on said insulator layer, said resistance layer being trapezoidal and having short sides facing each other.

16. Dosimeter of claim 8 wherein said semiconductor substrate is silicon.

17. Method of using the dosimeter of claim 1 which comprises providing said insulator layer with an initial value of electric charges, exposing said insulator layer having said initial value of electric charges to an energy dose of a radiation field while applying a voltage to said electrode gate contact for generating charges by said insulator layer and collecting said charges by said floating gate in dependence upon the radiation dosage whereby to permit measurement of the charge in electrical charges relative to said initial value as a function of the radiation energy dose exposure, and electrically resetting the electric charges to said initial value for taking a new such measurement with said dosimeter.

18. Method of using the dosimeter of claim 8 which comprises providing said insulator layer with an initial value of electric charges, exposing said insulator layer having said initial value of electric charges to an energy dose of a radiation field while applying a voltage to said metal contact for generating charges by said insulator layer and collecting said charges by said floating gate in dependence upon the radiation dosage whereby to permit measurement of the change in electrical charges relative to said initial value as a function of the radiation energy dose exposure, and electrically resetting the electric charges to said initial value for taking a new such measurement with said dosimeter.

* * * * *

UNITED STATES PATENT AND TRADEMARK OFFICE
CERTIFICATE OF CORRECTION

PATENT NO. : 4,788,581

DATED : November 29, 1988

INVENTOR(S) : Meinhard Knoll, Dietrich Braunig and Wolfgang Fahrner

It is certified that error appears in the above-identified patent and that said Letters Patent is hereby corrected as shown below:

On the Title Page, Item [75], should read -- Meinhard Knoll, Dietrich Bräunig and Wolfgang Fahrner, all of Berlin, Fed. Rep. of Germany--

Signed and Sealed this

Thirteenth Day of June, 1989

*Attest:*

DONALD J. QUIGG

*Attesting Officer*  *Commissioner of Patents and Trademarks*